(12) United States Patent
Patra

(10) Patent No.: US 9,671,699 B2
(45) Date of Patent: Jun. 6, 2017

(54) ILLUMINATION SYSTEM OF A MICROLITHOGRAPHIC PROJECTION EXPOSURE APPARATUS

(71) Applicant: Carl Zeiss SMT GmbH, Oberkochen (DE)

(72) Inventor: Michael Patra, Oberkochen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 149 days.

(21) Appl. No.: 14/632,430

(22) Filed: Feb. 26, 2015

(65) Prior Publication Data

US 2015/0185622 A1 Jul. 2, 2015

Related U.S. Application Data

(63) Continuation of application No. PCT/EP2012/004511, filed on Oct. 27, 2012.

(51) Int. Cl.
*G03F 7/20* (2006.01)
*G02B 27/09* (2006.01)
(Continued)

(52) U.S. Cl.
CPC ....... *G03F 7/70075* (2013.01); *G02B 3/0062* (2013.01); *G02B 26/0816* (2013.01);
(Continued)

(58) Field of Classification Search
CPC .. G03F 7/7058; G03F 7/70083; G03F 7/7066; G03F 7/70075; G03F 7/7015; G03F 7/70091
See application file for complete search history.

(56) References Cited

U.S. PATENT DOCUMENTS 7,061,582 B2 6/2006 Zinn et al.
2002/0141071 A1 * 10/2002 Singer ................ G03F 7/70083
359/636

(Continued)

FOREIGN PATENT DOCUMENTS

DE   10 2009 045 219 A   3/2011
DE   WO 2012028158 A1 * 3/2012 ......... G03F 7/70091
(Continued)

OTHER PUBLICATIONS

International Search Report for corresponding PCT Appl. No. PCT/EP2012/004211, dated Jul. 24, 2013.
(Continued)

*Primary Examiner* — Michelle M Iacoletti
(74) *Attorney, Agent, or Firm* — Fish & Richardson P.C.

(57) ABSTRACT

An illumination system of a microlithographic projection exposure apparatus comprises an optical integrator, which includes a first optical raster plate and a second optical raster plate. The first second optical raster plate comprising an array of first lenses having, along a reference direction, a first focal length $f_1$, and the second optical raster plate comprises an array of second lenses having, along the reference direction, a second focal length $f_2$. The vertices of the first lenses and vertices of the second lenses are spaced apart by a distance d that is greater than the second focal length $f_2$ so that $d > 1.01 \cdot f_2$. This ensures that laser pointing or another transient variation of the illumination of the optical integrator does not adversely affect the spatial irradiance distribution in a plane which is illuminated by the optical integrator.

23 Claims, 7 Drawing Sheets

(51) Int. Cl.
*G02B 3/00* (2006.01)
*G02B 26/08* (2006.01)

(52) U.S. Cl.
CPC ..... *G02B 27/0905* (2013.01); *G02B 27/0961* (2013.01); *G03F 7/7015* (2013.01); *G03F 7/70066* (2013.01)

(56) References Cited

U.S. PATENT DOCUMENTS

| | | | |
|---|---|---|---|
| 2003/0086524 A1 | 5/2003 | Schultz et al. | |
| 2006/0087634 A1 | 4/2006 | Brown et al. | |
| 2009/0115990 A1 | 5/2009 | Owa et al. | |
| 2013/0114060 A1* | 5/2013 | Patra | G03F 7/70091 355/71 |

FOREIGN PATENT DOCUMENTS

| | | |
|---|---|---|
| EP | 1 202 100 A2 | 5/2002 |
| EP | 1 262 836 A1 | 12/2002 |
| JP | 2000-089684 | 3/2000 |
| JP | 2002-040327 | 2/2002 |
| JP | 2010-192868 | 9/2010 |
| WO | WO 94/27254 | 11/1994 |
| WO | WO 2005/026843 A2 | 3/2005 |
| WO | WO 2011/039261 | 4/2011 |
| WO | WO 2012/034571 | 3/2012 |

OTHER PUBLICATIONS

Japanese Office Action, with translation thereof, for JP Appl No. 2015-538303, dated Apr. 25, 2016.
Aiello & Ornigotti, "Astigmatism makes beam shifts better", LabTalk, (2016), 3 pages.
Lee, H. et al., "Automatic Upright Adjustment of Photographs with Robust Camera Calibration", Journal of Latex Class Files, vol. 6, No. 1, 1-13, (Jan. 2007).
Redfern, J., "Video to Audio Conversion for the Visually Impaired", School of Computer Science & Informatics, Cardiff University, (May 2015), 46 pages.

* cited by examiner

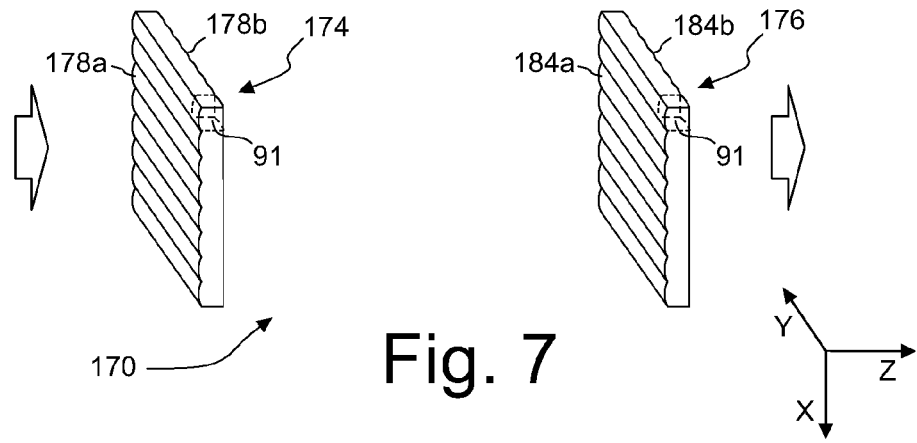
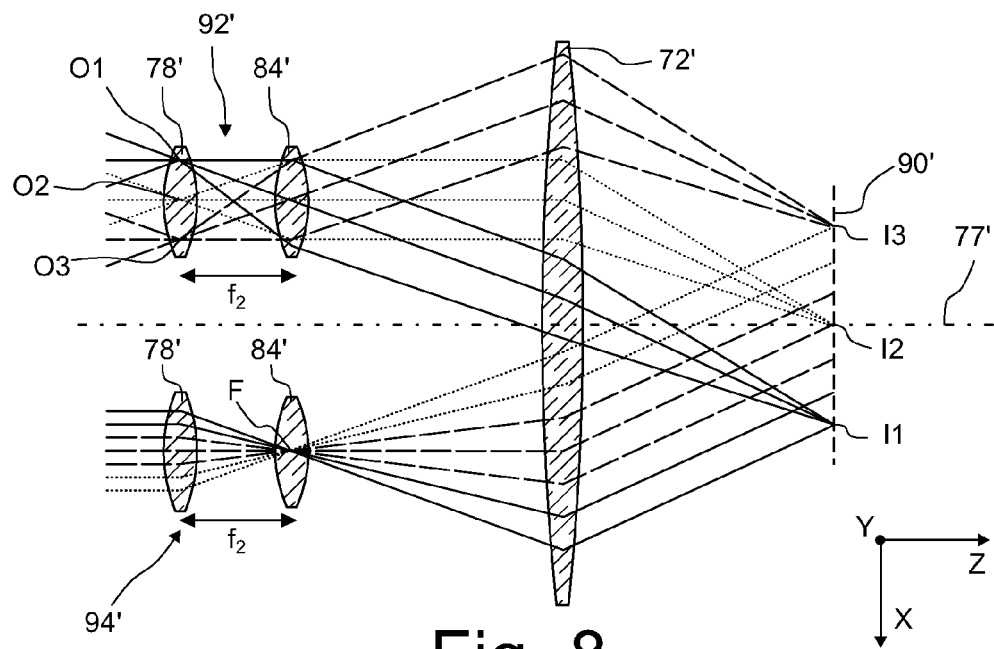
Fig. 7
Fig. 8
(Prior Art)
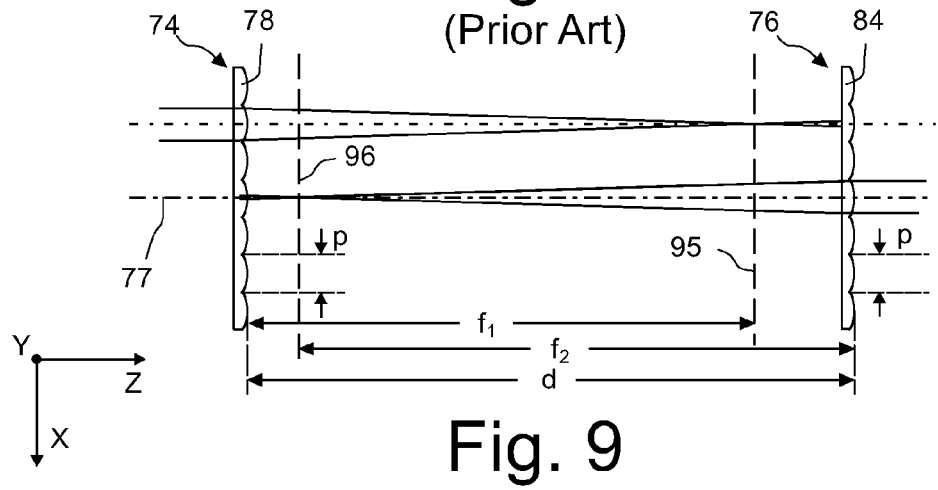
Fig. 9

ILLUMINATION SYSTEM OF A MICROLITHOGRAPHIC PROJECTION EXPOSURE APPARATUS

CROSS-REFERENCE TO RELATED APPLICATIONS

The present application is a continuation of, and claims benefit under 35 USC 120 to, international application PCT/EP2012/004511, filed Oct. 27, 2012, the entire disclosure of which is incorporated by reference herein.

BACKGROUND OF THE INVENTION

1. Field of the Invention

The invention generally relates to an illumination system of a microlithographic projection exposure apparatus, and in particular to an apparatus comprising an array of micromirrors or other beam deflecting elements that can be individually controlled.

2. Description of Related Art

Microlithography (also referred to as photolithography or simply lithography) is a technology for the fabrication of integrated circuits, liquid crystal displays and other microstructured devices. The process of microlithography, in conjunction with the process of etching, is used to pattern features in thin film stacks that have been formed on a substrate, for example a silicon wafer. At each layer of the fabrication, the wafer is first coated with a photoresist which is a material that is sensitive to light of a certain wavelength. Next, the wafer with the photoresist on top is exposed to projection light through a mask in a projection exposure apparatus. The mask contains a circuit pattern to be imaged onto the photoresist. After exposure the photoresist is developed to produce an image that corresponds to the circuit pattern contained in the mask. Then an etch process transfers the circuit pattern into the thin film stacks on the wafer. Finally, the photoresist is removed. Repetition of this process with different masks results in a multi-layered microstructured component.

A projection exposure apparatus typically includes an illumination system that illuminates a field on the mask that may have the shape of a rectangular or curved slit, for example. The apparatus further comprises a mask stage for aligning the mask, a projection objective (sometimes also referred to as 'the lens') that images the illuminated field on the mask onto the photoresist, and a wafer alignment stage for aligning the wafer coated with the photoresist.

One of the essential aims in the development of projection exposure apparatus is to be able to lithographically define structures with smaller and smaller dimensions on the wafer. Small structures lead to a high integration density, which generally has a favorable effect on the performance of the microstructured components produced with the aid of such apparatus.

Various approaches have been pursued in the past to achieve this aim. One approach is to improve the illumination of the mask. Ideally, the illumination system of a projection exposure apparatus illuminates each point of the field illuminated on the mask with projection light having a well defined spatial and angular irradiance distribution. The term angular irradiance distribution describes how the total light energy of a light bundle, which converges towards a particular point on the mask, is distributed among the various directions of the rays that constitute the light bundle.

The angular irradiance distribution of the projection light impinging on the mask is usually adapted to the kind of pattern to be imaged onto the photoresist. For example, relatively large sized features may require a different angular irradiance distribution than small sized features. The most commonly used angular irradiance distributions are referred to as conventional, annular, dipole and quadrupole illumination settings. These terms refer to the irradiance distribution in a pupil surface of the illumination system. With an annular illumination setting, for example, only an annular region is illuminated in the pupil surface. Thus there is only a small range of angles present in the angular irradiance distribution of the projection light, and all light rays impinge obliquely with similar angles onto the mask.

Different approaches are known in the art to modify the angular irradiance distribution of the projection light in the mask plane so as to achieve the desired illumination setting. For achieving maximum flexibility in producing different angular irradiance distribution in the mask plane, it has been proposed to use mirror arrays that determine the irradiance distribution in the pupil surface.

In EP 1 262 836 A1 the mirror array is realized as a micro-electromechanical system (MEMS) comprising more than 1000 microscopic mirrors. Each of the mirrors can be tilted about two orthogonal tilt axes. Thus radiation incident on such a mirror device can be reflected into almost any desired direction of a hemisphere. A condenser lens arranged between the mirror array and a pupil surface translates the reflection angles produced by the mirrors into locations in the pupil surface. This illumination system makes it possible to illuminate the pupil surface with a plurality of spots, wherein each spot is associated with one particular mirror and is freely movable across the pupil surface by tilting this mirror.

Similar illumination systems using mirror arrays are known from US 2006/0087634 A1, U.S. Pat. No. 7,061,582 B2 and WO 2005/026843 A2.

The mirror array, or a microlens array that is used to direct individual light beams onto the mirrors of the array so as to ensure that no light is lost in gaps formed between adjacent mirrors, should be illuminated by the projection light uniformly or with only moderate irradiance gradients. It is also important that transient variations of the projection light beam, which are produced by the light source of the illumination system, do not have any impact on the performance of the illumination system. For example, with excimer lasers, which are often used as light sources, effects are observed which are referred to as laser pointing or laser jitter. These effects manifest themselves as small variations of the direction of the projection light beam emerging from the light source.

In order to prevent that such variations have an adverse impact on the illumination of the mask, WO 2009/080279 A1 proposes to arrange a beam homogenizing unit between the light source and the mirror array or a microlens array placed in front of the mirror array. The beam homogenizing unit comprises an optical integrator, which includes a first and a second optical raster plate, and a condenser having a front focal plane in which the second optical raster plate of the optical integrator is arranged. Since the first optical raster plate is arranged in the front focal plane of the lenses of the second optical raster plate, this front focal plane is imaged on the back focal plane of the condenser. The angular light distribution at the first optical raster plate therefore has no impact on the spatial irradiance distribution in the back focal plane of the condenser. Since the images of the object planes of the lenses of the second optical raster plate superimpose in the back focal plane of the condenser, shifts of the irradiance distribution on the first optical raster plate only substantially affect the angular, but not the spatial light distribution in the back focal plane of the condenser.

However, an optical integrator necessarily increases the geometrical optical flux of the projection light. Thus the divergence of the projection light behind the optical integrator is greater than in front of it. However, for the beam homogenizing unit an increase of the divergence is not desired, because the divergence shall be increased only by the mirror array. The larger the divergence of the projection light is when it impinges on the mirror array, the larger will be the spots that are produced by the mirrors of the array in a subsequent pupil plane. But only with very small spots it is possible to produce arbitrary angular light distributions in the mask plane.

The increase of the divergence, which is produced by optical integrators if the input divergence does not exceed certain limits, can be kept small if the lenses of the second optical raster plate have a small refractive power, which implies large focal lengths of the lenses. However, a large focal length requires a large distance between the optical raster plates and also between the optical integrator and the condenser. This problem can be solved by the use of folding mirrors. However, if the divergence of the projection light is small, optical crosstalk between adjacent channels of the optical integrator produced by diffracted light becomes an issue. In conventional optical integrators which are designed to increase the divergence significantly, the distance between the optical raster plates is so small that light, which is diffracted by the regular arrangement of lenses, will remain confined within the respective channel of the optical integrator. However, if the divergence is small and the distance between the optical raster plates becomes large, diffracted light may enter adjacent channels and contribute to optical crosstalk.

Optical crosstalk in optical integrators modifies the irradiance distribution in the back focal plane of the condenser of the beam homogenizing unit. The main problem is that the optical crosstalk usually changes if the direction of the impinging light beam is not stable. Then laser pointing or other transient disturbances may change the spatial irradiance distribution in the back focal plane of the condenser of the beam homogenizing unit. This will ultimately change the angular light distribution in the mask plane. In other words, optical crosstalk destroys the property of the beam homogenizing unit to produce a superimposed spatial irradiance distribution which is substantially independent of the angular distribution of the light impinging on the optical integrator.

SUMMARY OF THE INVENTION

It is therefore an object of the present invention to provide an illumination system comprising an optical integrator. A superimposed spatial irradiance distribution produced by the optical integrator in the far field (or in the back focal plane of a condenser, which is equivalent) shall be substantially independent of the angular distribution of the light impinging on the optical integrator even if the optical integrator only slightly increases the divergence of the light propagating through the optical integrator.

According to the invention this object is achieved with an illumination system of a microlithographic projection exposure apparatus comprising an optical integrator. The optical integrator comprises a first optical raster plate comprising an array of first lenses having, along a reference direction, a first focal length $f_1$. A second optical raster plate comprises an array of second lenses having, along the reference direction, a second focal length $f_2$. The vertices of the first lenses and the vertices of the second lenses are spaced apart by a distance d that is greater than the second focal length $f_2$ with $d > 1.01 \cdot f_2$.

The inventor has perceived that optical crosstalk cannot be completely avoided even if the optical integrator increases the divergence only slightly and the input divergence is small. However, it is possible to eliminate the main adverse effect of optical crosstalk caused by diffracted light, namely the sensitivity of the optical integrator to transient variations of the angular light distribution of the incoming light. It has been found that if the first lenses are not arranged in the front focal plane of the second lenses, but a bit further away from it, this sensitivity can be significantly or even completely reduced. Since the second focal length $f_2$ typically is in the range of several hundred millimeters in the case of optical integrators that increase the divergence only slightly, an increase of the distance by only 1% implies that the distance between the optical raster plates will be increased by at least some millimeters, and often by some centimeters.

The increase of the distance between the first and second optical raster plate has the effect that changes of the far field spatial irradiance distribution, which are produced by diffracted light contributing to optical crosstalk if the angular light distribution on the first optical raster plate varies, are compensated for. This exploits the inverting effect of the second lenses. However, only a rigorous computation that takes into account the wave nature of the light can fully explain how the defocused arrangement of the first lenses reduces the sensitivity of the optical integrator to transient variations of the angular light distribution of the incoming light.

The ratio $d/f_2$ that has to be selected for a particular application mainly depends on the geometric parameters of the optical raster plates, in particular the pitch of the first and second lenses, the wavelength of the projection light and its divergence. In some applications d may exceed $1.02 \cdot f_2$ or even $1.05 \cdot f_2$. Generally the ratio $d/f_2$ increases the smaller the divergence is that is produced by the optical integrator.

As it has been mentioned above, the optical crosstalk becomes an issue only if the divergence produced by the optical integrator is small. This divergence (full angle) is equal to $p/f_2$, wherein p is the pitch of the second lenses and $f_2$ is their focal length. The distance of the diffractive orders of a single channel of the optical integrator is equal to $\lambda/p$. If one divides the divergence $p/f_2$ by the distance between adjacent diffractive orders $\lambda/p$, the parameter $p^2/(\lambda \cdot f_2)$ indicates the number of diffractive orders that are received within the divergence. If this number is small, there are many diffractive orders that are not received in the divergence and thus contribute to optical crosstalk.

In some embodiments the number k is below 40, in others below 20 and in still further embodiments below 10. The smaller the number k is, the greater will be the benefits that are obtained by increasing the distance d between the optical raster plates beyond the conventional value of the focal length $f_2$ of the second lenses.

Conditions with k smaller than 40, 20 or even 10 often occur if the optical integrator is arranged between a light source and a spatial light modulator which is configured to vary a spatial irradiance distribution in a pupil surface of the illumination system. However, there may also be other applications in illumination systems in which an optical integrator is required that increases the divergence only slightly.

Such a spatial light modulator may comprise a beam deflection array of the reflective or transparent beam deflection elements. Each beam deflection element may be configured to deflect a light beam by a deflection angle that is variable in response to a control signal applied to the beam deflection element. In particular the beam deflecting elements may be formed by tiltable mirrors.

The invention is equally applicable for symmetric optical integrators, for which the focal length $f_1$ of the first lenses is equal to the focal length $f_2$ of the second lenses, and in asymmetric optical integrators for which $f_1 \neq f_2$.

In some embodiments the illumination system comprises a condenser having a front focal plane in which the second optical raster plate is arranged. However, the optical integrator may also be used without a subsequent condenser.

DEFINITIONS

The term "light" denotes any electromagnetic radiation, in particular visible light, UV, DUV and VUV light.

The term "light ray" is used herein to denote light whose path of propagation can be described by a line.

The term "light bundle" is used herein to denote a plurality of light rays that have a common origin in a field plane.

The term "light beam" is used herein to denote light that passes through a particular lens or another optical element.

The term "optical integrator" is used herein to denote an optical system that increases the product NA·a, wherein NA is the numerical aperture and a is the illuminated field area.

The term "condenser" is used herein to denote an optical element or an optical system that establishes (at least approximately) a Fourier relationship between two planes, for example a field plane and a pupil plane.

The term "spatial irradiance distribution" is used herein to denote how the total irradiance varies over a real or imaginary surface on which light impinges. Usually the spatial irradiance distribution can be described by a function $I_s(x, y)$, with x, y being spatial coordinates of a point in the surface. If applied to a field plane, the spatial irradiance distribution necessarily integrates the irradiances produced by a plurality of light bundles.

The term "angular irradiance distribution" is used herein to denote how the irradiance of a light bundle varies depending on the angles of the light rays that constitute the light bundle. Usually the angular irradiance distribution can be described by a function $I_\alpha(\alpha, \beta)$, with $\alpha$, $\beta$ being angular coordinates describing the directions of the light rays. If the angular irradiance distribution has a field dependency, $I_\alpha$ will be also a function of field coordinates, i.e. $I_\alpha = I_\alpha(\alpha, \beta, x, y)$.

The term "surface" is used herein to denote any planar or curved surface in the three-dimensional space. The surface may be part of a body or may be completely separated therefrom, as it is usually the case with a field or a pupil plane.

The term "optical power" is used to denote the ability of an optical element to have a diverging or converging effect on light. A positive optical power thus has a converging effect, and a negative optical power has a diverging optical effect.

The term "converging effect" means that the convergence is increased, irrespective of whether the incoming light is diverging, parallel or already converging. If the incoming light is divergent, the convergence has to be increased to such an extent that the light beams emerging from the optical elements are at least slightly converging.

BRIEF DESCRIPTION OF THE DRAWINGS

Various features and advantages of the present invention may be more readily understood with reference to the following detailed description taken in conjunction with the accompanying drawings in which:

FIG. 7 is a perspective view on two optical raster plates containing cylindrical microlenses according to an alternative embodiment;

FIG. 8 is a schematic meridional section through a prior art beam homogenizing unit;

FIG. 9 is a meridional section through an optical integrator of the beam homogenizing unit shown in FIG. 4;

DESCRIPTION OF PREFERRED EMBODIMENTS

I. General Construction of Projection Exposure Apparatus

Figure 1:
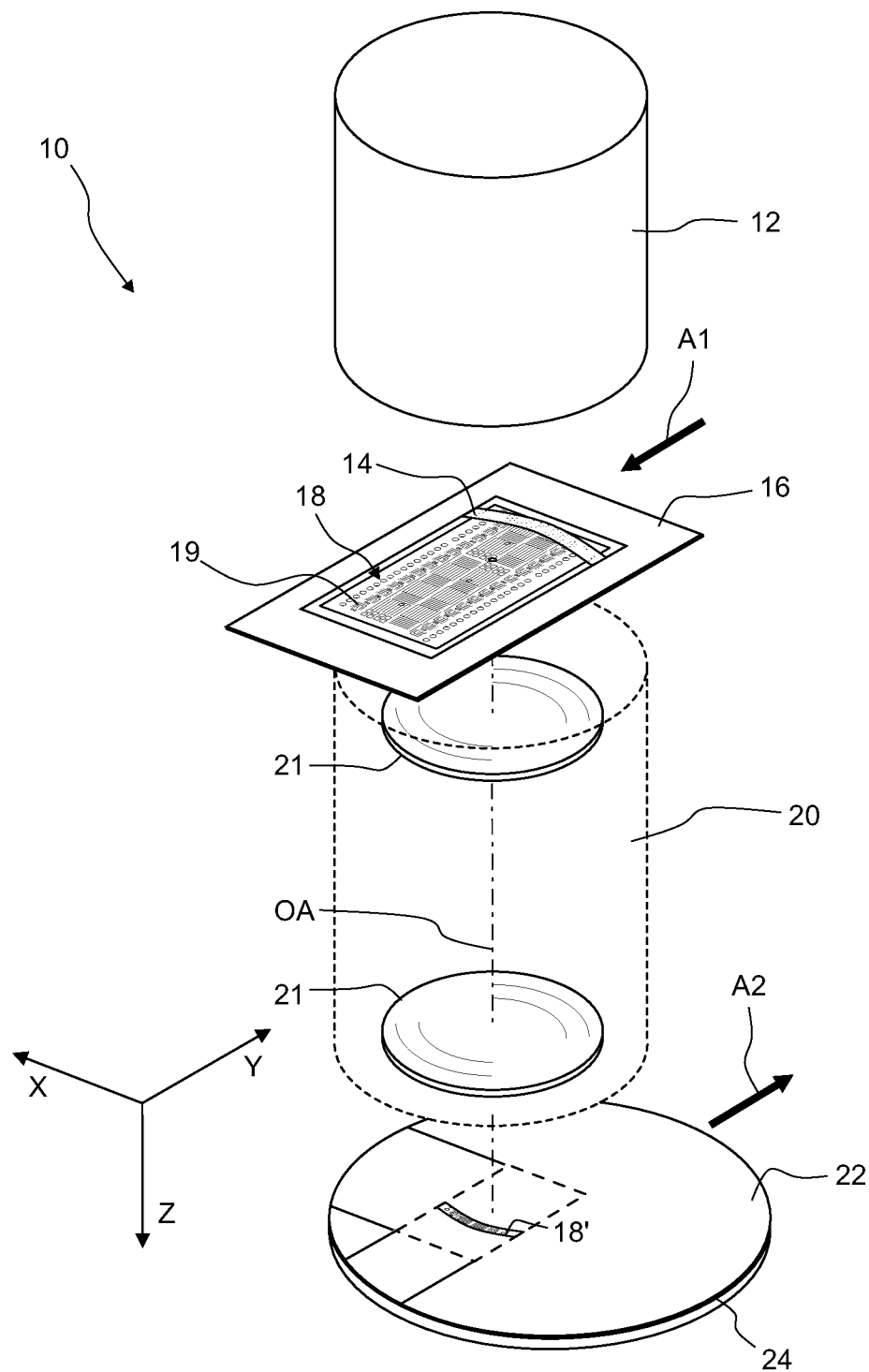
FIG. 1 is a schematic perspective view of a projection exposure apparatus in accordance with one embodiment of the present invention.

FIG. 1 is a perspective and highly simplified view of a projection exposure apparatus 10 in accordance with the present invention. The apparatus 10 comprises an illumination system 12 which produces a projection light beam. The latter illuminates a field 14 on a mask 16 containing a pattern 18 of fine features 19. In this embodiment the illuminated field 14 has the shape of a ring segment. However, other shapes of the illuminated field 14, for example rectangles, are contemplated as well.

A projection objective 20 having an optical axis OA and containing a plurality of lenses 21 images the pattern 18 within the illuminated field 14 onto a light sensitive layer 22, for example a photoresist, which is supported by a substrate 24. The substrate 24, which may be formed by a silicon wafer, is arranged on a wafer stage (not shown) such that a top surface of the light sensitive layer 22 is precisely located in an image plane of the projection objective 20. The mask 16 is positioned via a mask stage (not shown) in an object plane of the projection objective 20. Since the latter has a magnification β with |β|<1, a minified image 18' of the pattern 18 within the illuminated field 14 is projected onto the light sensitive layer 22.

During the projection the mask 16 and the substrate 24 move along a scan direction which corresponds to the Y direction indicated in FIG. 1. The illuminated field 14 then scans over the mask 16 so that patterned areas larger than the illuminated field 14 can be continuously imaged. The ratio between the velocities of the substrate 24 and the mask 16 is equal to the magnification β of the projection objective 20. If the projection objective 20 inverts the image (β<0), the mask 16 and the substrate 24 move in opposite directions, as is indicated in FIG. 1 by arrows A1 and A2. However, the present invention may also be used in stepper tools in which the mask 16 and the substrate 24 do not move during projection of the mask.

II. General Construction of Illumination System

Figure 2:
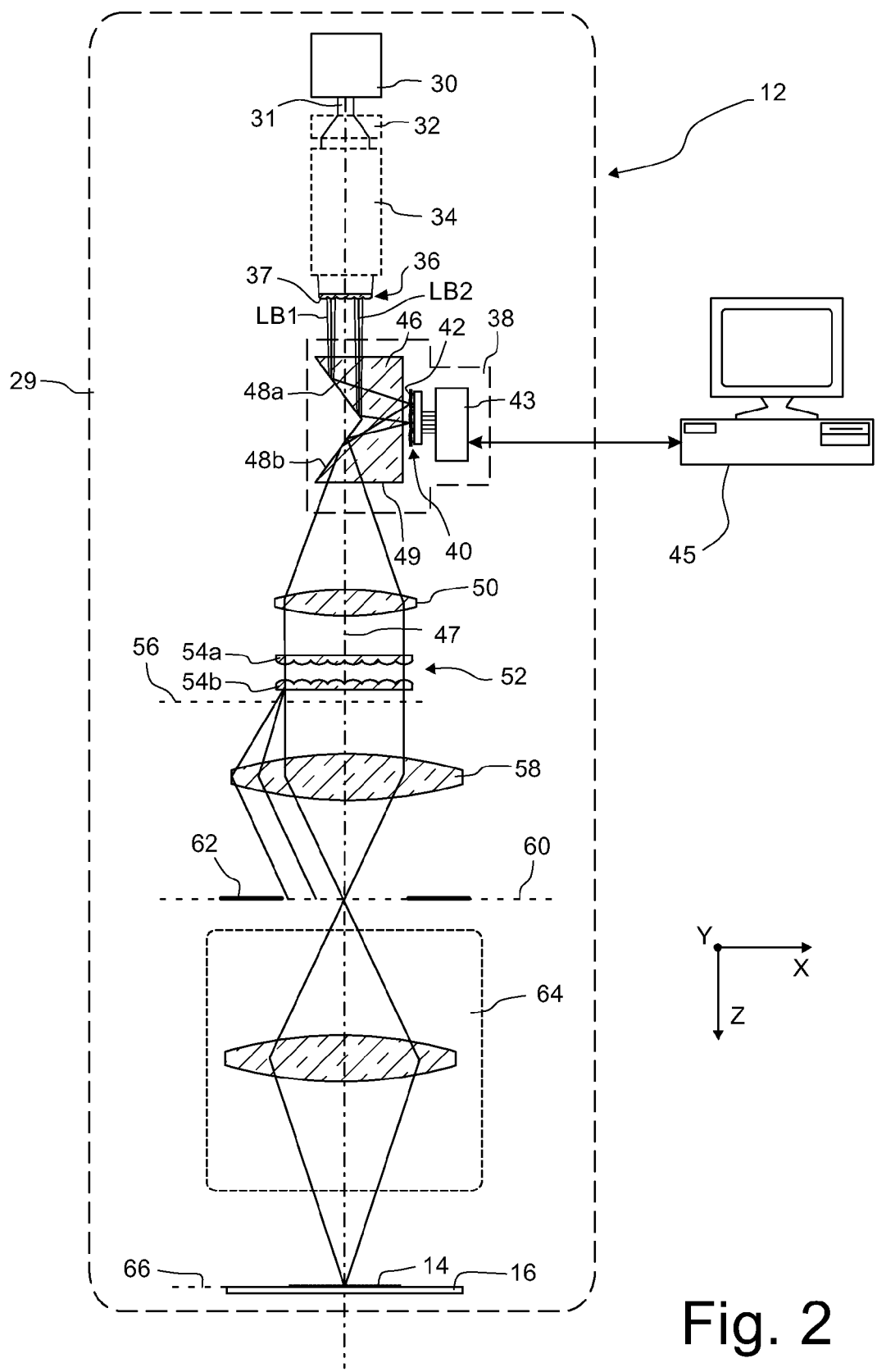
FIG. 2 is a meridional section through an illumination system which is part of the apparatus shown in FIG. 1.

FIG. 2 is a meridional section through the illumination system 12 shown in FIG. 1. For the sake of clarity, the illustration of FIG. 2 is considerably simplified and not to scale. This particularly implies that different optical units are represented by one or very few optical elements only. In reality, these units may comprise significantly more lenses and other optical elements.

The illumination system 12 includes a housing 29 and a light source 30 that is, in the embodiment shown, realized as an excimer laser. The light source 30 emits a beam 31 of projection light having a wavelength of about 193 nm. Other types of light sources 30 and other wavelengths, for example 248 nm or 157 nm, are also contemplated.

In the embodiment shown, the light beam 31 emitted by the light source 30 enters a beam expansion unit indicated at 32 in which the light beam is expanded. To this end the beam expansion unit 32 may comprise several lenses or planar mirrors, for example. The expanded light beam 31 emerging from the beam expansion unit 32 has a low divergence, i.e. it is almost collimated.

The light beam 31 then enters a beam homogenizing unit 34 which homogenizes the light beam 31 and stabilizes the angular distribution of the projection light at mask level. The layout and the function of the beam homogenizing unit 34 will be explained in more detail below in section III.

After homogenization the light beam 31 impinges on a beam dividing array 36. The latter divides the light beam 31 into a plurality of individual converging light beams from which only two denoted by LB1, LB2 are shown in FIG. 2. To this end the dividing array 36 comprises a plurality of small microlenses 37. Possible configurations of the dividing array 36 are disclosed in PCT/EP2010/005628, for example. Alternatively, the beam dividing array 36 may comprise an array of diffractive optical elements, as it is disclosed in WO 2005/026843 A2, or it may be completely dispensed with.

The converging light beams LB1, LB2 then propagate through a spatial light modulator 38 that is used to produce variable spatial irradiance distributions in a subsequent pupil plane. In this embodiment the spatial light modulator 38 comprises an array 40 of micromirrors 42 that can be tilted individually about two orthogonal axes with the help of actuators. The actuators are controlled by a control unit 43 which is connected to an overall system control 45.

Figure 3:
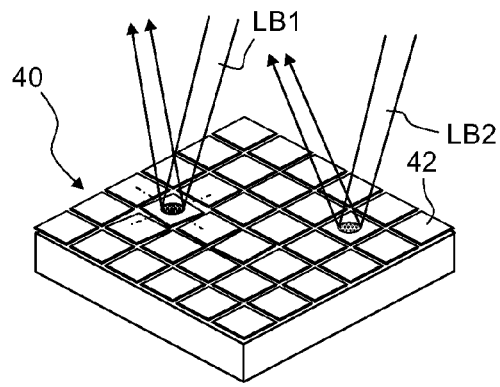
FIG. 3 is a perspective view of a mirror array contained in the illumination system shown in FIG. 2.

FIG. 3 is a perspective view of the array 40 illustrating how the converging light beams LB1, LB2 are reflected into different directions depending on the tilting angles of the micromirrors 42 on which the light beams LB1, LB2 impinge. In FIGS. 2 and 3 the array 40 comprises only 66 micromirrors 42; in reality the array 40 may comprise several hundreds or even several thousands micromirrors 42.

Referring again to FIG. 2, the spatial light modulator 38 further comprises a prism 46 having a first planar surface 48a and a second planar surface 48b that are both inclined with respect to an optical axis 47 of the illumination system 12. At these inclined surfaces 48a, 48b the light beams LB are reflected by total internal reflection. The first surface 48a reflects the impinging light beams LB1, LB2 towards the micromirrors 42 of the micromirror array 40, and the second surface 48b directs the light beams LB1, LB2 reflected from the micromirrors 42 towards an exit surface 49 of the prism 46.

The directions of the light beams LB1, LB2, and thus the angular irradiance distribution of the light emerging from the exit surface 49 of the prism 46, can thus be varied by individually tilting the micromirrors 42 of the array 40. More details with regard to the spatial light modulator 40 can be gleaned from US 2009/0115990 A1, for example.

The angular irradiance distribution produced by the spatial light modulator 38 is transformed into a spatial irradiance distribution with the help of a first condenser 50 which directs the impinging light beams LB1, LB2 towards a field defining optical integrator 52. In this embodiment the field defining optical integrator 52 comprises two optical raster plates 54a, 54b each containing two orthogonal arrays of cylindrical microlenses. The field defining optical integrator 52 produces a plurality of secondary light sources in a subsequent pupil plane 56 of the illumination system 12. A second condenser 58 establishes a Fourier relationship between the pupil plane 56 and a field stop plane 60 in which an adjustable field stop 62 is arranged. The second condenser 58 superimposes the light beams emerging from the secondary light sources in the field stop plane 60 so that the latter is illuminated very homogenously.

The field stop plane 60 is imaged by a field stop objective 64 onto a mask plane 66 in which the mask 16 supported on a mask stage (not shown) is arranged. Also the adjustable field stop 62 is thereby imaged on the mask plane 66 and defines at least the short lateral sides of the illuminated field 14 extending along the scan direction Y.

The spatial irradiance distribution in front of the field defining optical integrator 52 determines the spatial irradiance distribution in the pupil plane 56 and thus the angular irradiance distribution in the field stop plane 60 and the mask plane 66. By carefully setting the tilting angles of the micromirrors 42 of the mirror array 40 with the help of the control unit 43, it is thus possible to quickly produce almost any arbitrary angular irradiance distribution in the mask plane 66. This, in turn, makes it possible to quickly adapt the angular irradiance distribution in the mask plane 66 to the pattern 18 contained in the mask 16. Using an angular irradiance distribution which is specifically tailored to the pattern 18, the latter can be imaged more accurately onto the light sensitive layer 22.

III. Beam Homogenizing Unit

Figure 4:
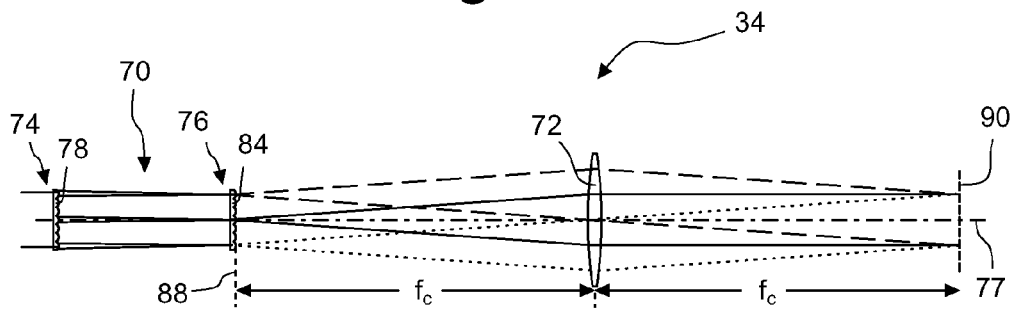
FIG. 4 is a meridional section through a beam homogenizing unit which is also part of the illumination system shown in FIG. 2.

FIG. 4 is a meridional section through the beam homogenizing unit 34 shown in FIG. 2. The beam homogenizing unit 34 comprises a homogenizing optical integrator 70 and a condenser 72. The homogenizing optical integrator 70 includes a first optical raster plate 74 and a second optical raster plate 76 that are spaced apart along an optical axis 77 of the beam homogenizing unit 34.

Figures 5, 6:
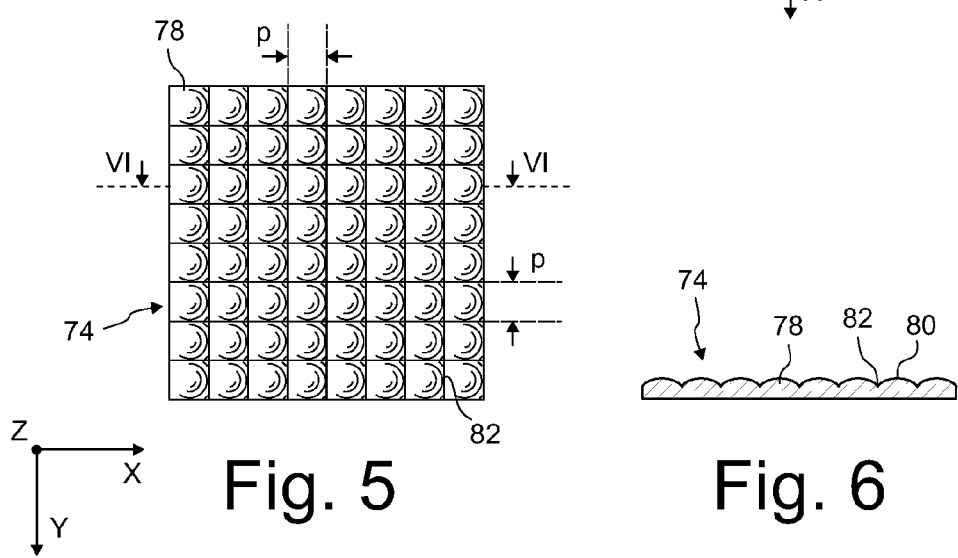
FIG. 5 is a top view on an optical raster plate contained in the beam homogenizing unit shown in FIG. 4.
FIG. 6 is a cross section along line VI-VI through the optical raster plate shown in FIG. 5.

As it can be seen in the top view of FIG. 5, the first optical raster plate 74 comprises a plurality of first lenses 78 which are arranged in a regular grid-like array with equal pitch p along the X and Y direction. FIG. 6, which is a cross-section through the first optical raster plate 74 shown in FIG. 5 along line VI-VI, illustrates that the first lenses 78 have a positive refractive power and are realized, in the embodiment shown, as planar-convex microlenses. Each first lens 78 has a curved surface 80 which is delimited by a square edges 82, see FIG. 5. Configurations with different pitches $p_x$, $p_y$ along the X and Y direction, respectively, or having differently shaped borderlines 82 and/or having a different refractive power along the X and Y direction are also contemplated.

The second optical raster plate 76 comprises second lenses 84 and has substantially the same configuration as the first optical raster plate 74. In particular it is assumed, without loss of generality, that the second lenses 84 have the same pitch p along the X and Y direction. The refractive power, and thus the focal length of the first and of the second lenses 78, 84, however, may be different.

FIG. 7 shows an alternative embodiment of a homogenizing optical integrator 170 comprising optical raster plates 174, 176. Each optical raster plate 174, 176 comprises two arrays of parallel cylindrical lenses 178a, 178b and 184a, 184b, respectively, wherein the cylindrical lenses 178a, 178b and 184a, 184b on opposite sides of the optical raster plates 174, 176 extend along orthogonal directions Y and X. A volume 90 that is confined by two orthogonal cylindrical lenses 178a, 178b or 184a, 184b corresponds to a single lens 78 or 84 of the optical integrator 70 shown in FIGS. 5 and 6.

In the embodiment of the beam homogenizing unit 34 shown in FIG. 4 the condenser 72 consists of a single positive lens having a focal length $f_c$. In a front focal plane 88 of the condenser 72 the second optical raster plate 76 is arranged, and in a back focal plane 90 of the condenser 72 the dividing array 36 of the illumination system 12 is arranged.

In other embodiments the condenser 72 is assembled from more than one lens or other optical elements, and consequently it may have a front focal length which differs from a back focal length.

In the following it will first be briefly explained with reference to FIG. 8 how a conventional beam homogenizer comprising an optical integrator and a condenser functions. An example of such a conventional beam homogenizer is the combination of the field defining optical integrator 52 and the second condenser 58 shown in FIG. 2.

Lenses 78', 84' of the first and second optical raster plates 74', 76' that are arranged along lines extending parallel to the optical axis 77' form a plurality of optical channels from which only two denoted by 92', 94' are shown in FIG. 8. Each optical channel 92', 94' has the property that projection light is, at least if diffraction is disregarded, confined to the respective channel 92, 94 once it has entered the first lens 78' which is associated with this particular optical channel. In other words, projection light is not permitted to leave an optical channel and to enter an adjacent optical channel. Such a change of the channels is referred to in this context as optical crosstalk.

A characterizing feature of conventional optical integrators is that the first lenses 78' are arranged in the front focal planes of the second lenses 84'. Since the latter are arranged in the front focal plane of the condenser 72', the spatial irradiance distribution on the first lenses 78' is imaged on the back focal plane 90' of the condenser 72'. This is illustrated in the upper portion of FIG. 8 for three object points O1, O2, O3 which are imaged by the second lens 84' and the condenser 72' on image points I1, I2 and I3, respectively.

From FIG. 8 it becomes clear that each optical channel 92', 94' illuminates the same area confined by the marginal image points I1 and I3 in the back focal plane 90' of the condenser 72'. Thus the spatial irradiance distributions on the first lenses 78', which may differ to some extent, are superimposed in the back focal plane 90'. This superposition results in a very uniform spatial irradiance distribution in the back focal plane 90'.

As it is typical of an imaging relationship, the angular light distribution in the object plane, for example at the object points O1, O2, O3, does not have any impact on the spatial irradiance distribution in the image plane, i.e. the back focal plane 90' of the condenser 72'. This is an important property of the beam homogenizer, because it ensures that variations of the angles of incidence of projection light impinging on the first lenses 78' do not change the spatial irradiance distribution in the back focal plane 90'. Such variations of the angles of incidence may occur, for example, if the projection light beam 31 produced by the light source 30 is not perfectly stable, but slightly changes its direction in the medium or long term. Such variations, which are sometimes referred to as laser pointing, cannot be easily suppressed. With a beam homogenizer as shown in FIG. 8, however, the impact of laser pointing on the uniformity of the spatial irradiance distribution in the back focal plane 90' of the condenser 72' could be successfully reduced if diffraction was disregarded.

Laser pointing usually also implies that the irradiated area on the first lenses 78' slightly varies. As long as complete optical channels 92', 94' are either illuminated or not illuminated, this has no impact on the spatial irradiance distribution in the back focal plane 90'. Then simply the task of illuminating the complete field in the back focal plane 90' is transferred from one optical channel to another. Only if optical channels are illuminated partially, this will have an effect on the spatial irradiance distribution in the back focal plane 90'. However, if the number of optical channels is large enough, which implies that the pitch of the lenses 78' 84' is small, variations of the spatial irradiance distribution caused by partially illuminated optical channels can be neglected.

In the lower half of FIG. 8 the conditions are shown if parallel projection light impinges on the first lenses 78'. If the focal length $f_1$ of the first lenses 78' is equal to the focal length $f_2$, the optical integrator is symmetric and the focal points F of the first lenses 78' are located inside the second lenses 84'. The smaller the divergence of the incoming projection light is, the higher will be the intensities at the focal points F. For that reason the focal length $f_1$ of the first lenses 78' is usually determined such that the highest light intensities are obtained at locations where no damages caused by high light intensities are to be expected. For example, the focal points F may be located completely outside the second lenses 84', or at least outside of optical surfaces on which a sensitive antireflection coating is applied.

FIG. 9 is a meridional section through the homogenizing optical integrator 70 of the beam homogenizing unit 34 in accordance with the present invention. The first lenses 78 of the first optical raster plate 74 have, at least along the X direction, a focal length $f_1$ which is, in this embodiment, smaller than the distance d by which vertices 100 of the first lenses 78 and vertices 102 of the second lenses 84 are spaced apart along the Z direction which is parallel to the optical axis 77 of the beam homogenizing unit 34. The optical axis 77 coincides with the axis of rotational symmetry of the condenser 72. Therefore the focal plane 95 containing the focal points produced by the first lenses 76 will be arranged outside the second optical raster element 76 so that the risk of damages caused by high light intensities can be neglected.

The focal length $f_2$ of the second lenses 84 is also smaller than the distance d. In the embodiment shown d≈1.06·$f_2$, i.e. the distance d is about 6% larger than the focal length $f_2$. The first optical raster plate 74 is thus, in contrast to the conventional arrangement shown in FIG. 8, not arranged in a front focal plane 96 of the second lenses 84 of the second optical raster plate 76, but is arranged in a position further away from it. This defocused arrangement has the effect that optical crosstalk produced by diffracted light does not adversely affect the stabilizing effect of the beam homogenizing unit 34. More specifically, the condition d>1.01·$f_2$ ensures that the spatial irradiance distribution in the back focal plane 90 of the condenser 72 does not, or at least not considerably, depend on the direction of the incoming projection light.

The effect of the defocused arrangement of the first optical raster plate 74 cannot be fully understood merely on the basis of geometrical optics. Only on the basis of a rigorous mathematical description that also takes into account diffractive effects it is possible to comprehensively explain this effect and to determine the ideal ratio $d/f_2$.

In the following it will nevertheless be attempted to explain on a more illustrative basis how the defocused arrangement of the first optical raster plate 74 prevents that the spatial irradiance distribution in the back focal plane 90 of the condenser 72 changes if the direction of the projection light impinging on the homogenizing optical integrator 70 varies.

IV. Discussion

Figure 10:
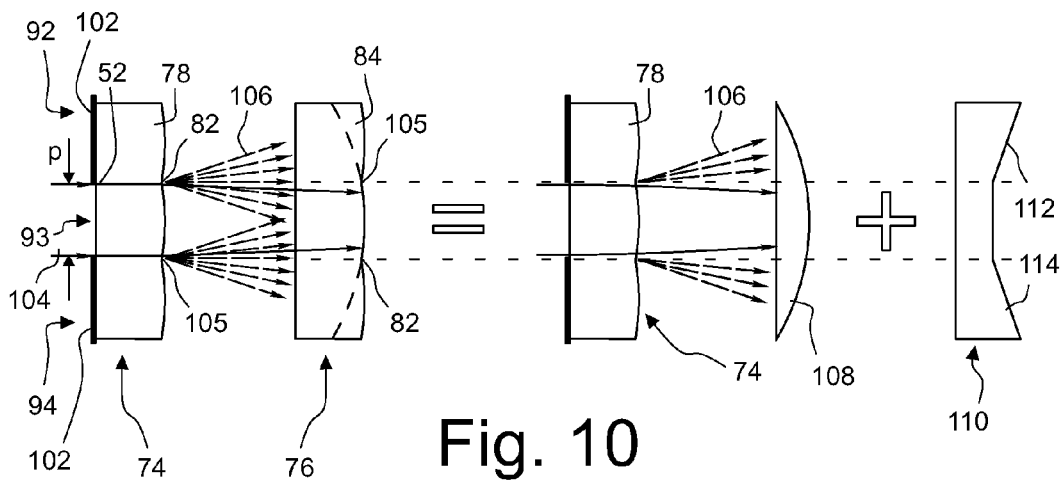
FIG. 10 is a schematic illustration how three adjacent lenses of the second optical raster plate may be considered as a combination of a single larger lens and a prism.

FIG. 10 shows on the left hand side a portion of the homogenizing optical integrator 70 (not to scale) comprising three adjacent optical channels 92, 93, 94. In the following only projection light impinging on the central optical channel 93 will be considered; the adjacent optical channels 92, 94 are assumed to be shielded by absorptive plates 102.

Projection light indicated at 104 impinging on the central optical channel 93 is refracted at the first lens 78 of the first optical raster plate 74. A larger part of the projection light 104 propagates exclusively within the central optical channel 93 and finally emerges from the associated second lens 84 of the subsequent second optical raster plate 76.

However, the regular arrangement of the edges 82 of the first lenses 78 forms a grid that produces a diffraction pattern in the far field (Fraunhofer diffraction) that can be described using the concepts that have been developed for multiple slits. In FIG. 10 several adjacent diffraction orders 106 are indicated by broken lines. The angular distance between the diffraction orders 106 is equal to the ratio λ/p, wherein λ is the wavelength of the projection light and p is the pitch of the lenses 78. In FIG. 10 it is assumed that a significant number of diffraction orders 106 is not confined to the central optical channel 93, but enters the adjacent optical channels 92, 94 and thus contributes to optical crosstalk.

The field defining optical integrator 52, which is used to produce a uniform spatial irradiance distribution in the intermediate image plane 60 of the illumination system 12, has to increase the geometrical optical flux significantly. The geometrical optical flux is defined as the product image height times numerical aperture NA. Since the numerical aperture NA in the intermediate image plane 60 shall be significant (particularly in cases in which also the projection objective 20 has a large numerical aperture, for example NA=1.2), the increase of the geometrical optical flux produced by the field defining optical integrator 52 has to be quite large. In other words, the field defining optical integrator 52 has to produce a large divergence which is equal to the ratio $p/f_2$, wherein p is the pitch of the lenses 78, 84, and $f_2$ is the focal length of the second lenses 84. A large divergence thus implies that the pitch p is large and the focal length $f_2$ is small. This results in an arrangement in which the first and the second optical raster plates 54a, 54b are arranged in immediate vicinity, because, at it has been explained above with reference to FIG. 8, the distance between the optical raster plates 54a, 54b usually equals the focal length $f_2$ of the second lenses.

With the homogenizing optical integrator 70 contained in the beam homogenizing unit 34, the conditions are quite different. Here it is not desired that the homogenizing optical integrator 70 increases the geometrical optical flux. Only if the light emerging from the beam homogenizing unit 34 is still substantially collimated, it is possible to define the spatial irradiance distribution in the pupil plane 56 mainly with the help of the optical modulator 38. If the light reflected at the mirror array 42 had a large divergence, the spots produced on the field defining optical integrator 52 would be too large to accurately produce a desired spatial irradiance distribution and thus to obtain the desired illumination setting.

If the divergence of the homogenizing optical integrator 70 contained in the beam homogenizing unit 34 shall be small, the pitch p of the lenses 78, 84 has to be small and the focal length $f_2$ of the second lenses 84 has to be large. This results in a large distance d between the first and the second optical raster plates 74, 76. The distance d may be so large that it may be helpful to arrange a beam folding mirror between the two optical raster plates 74, 76 so as to reduce the overall dimensions of the beam homogenizing unit 34.

Referring again to FIG. 10, many of the diffraction orders 106 do not impinge, because of the large distance d, on the second lens 84 belonging to the same optical channel 93, but on an a second lens belonging to an adjacent optical channel 92, 94. Thus, in the case of optical integrators that only slightly increase the geometrical optical flux, the portion of diffracted light that contributes to optical crosstalk is significant.

In order to determine how severe the problem of optical crosstalk is, one may simply determine how many diffraction orders leave the optical channel. In this context a quantity k may be defined as $$k = p^2/(\lambda \cdot f_2) \tag{1}$$

Here k is equal to the number of diffraction orders 106 which remain in the optical channel such that they are "contained" in the divergence produced by the homogenizing optical integrator 70. This number k is equal to the ratio between the total divergence, which is given by $p/f_2$, and the distance between adjacent diffractive orders, which is given by λ/p. The smaller the number k is, the larger is the number of diffraction orders which are not contained in the divergence produced by the homogenizing optical integrator 70 and thus contribute to optical crosstalk.

In the field defining optical integrator 52 the parameter k is, depending on the direction X or Y, in a range between several hundreds and several thousands. In the homogenizing optical integrator 70 of the beam homogenizing unit 34, however, the parameter k is usually smaller than 40, often smaller than 20 or even smaller than 10.

In the following it will be explained in more detail how optical crosstalk compromises the stabilizing property of the optical integrator 70, and how this negative effect is compensated by the defocused arrangement of the first optical raster plate 74 with $d>f_2$.

For illustrative reasons, the portion of the second optical raster plate 76, which is shown in FIG. 10 and comprises the central channel 93 and two adjacent channels 92, 94, is conceptionally divided into a single larger lens 108, which extends over all three optical channels 92, 93, 94, and a prism 110 containing two wedge portions 112, 114. The wedge portions 112, 114 have twice the slope as the slope at the edges 82 of the second lenses 84.

If the prism 110 was absent so that the diffraction orders 106 were incident only on the larger lens 108, there would be no effect on the spatial irradiance distribution in the back focal plane 90 of the condenser 72. However, this changes if also the the optical effects associated with the prism 110 are taken into account.

Figure 11:
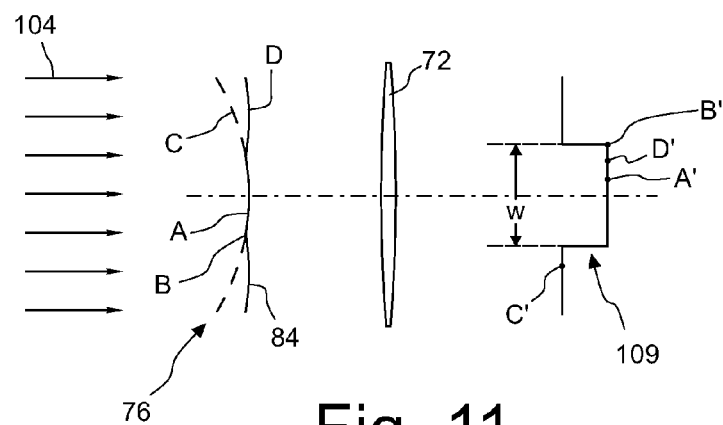
FIG. 11 is a schematic illustration how the far field irradiance distribution is affected by optical crosstalk.

This will be explained in the following with reference to the schematic illustration of FIG. 11. Projection light 104 impinging at a position A on the central channel 93 of the second optical raster plate 76 will contribute to the irradiance somewhere at a point A' within the spatial irradiance distribution 109 that is produced in the back focal plane 90. Projection light impinging at a position B will contribute to a point B' on the edge B' of the spatial irradiance distribution 109. In the absence of the prism 110, light leaving the optical channel and impinging at a position C on the lens 108 would contribute to the irradiance at a point C' in the spatial irradiance distribution 109.

However, if one correctly considers the effect of the wedge portions 112, 114 of the prism 110, it can be seen that light leaving the optical channel will be deflected by the wedge portions 112, 114 by a distance which is equal to the width w of the spatial irradiance distribution, because the wedge angle is twice the edge angle of the second lenses 84. Therefore diffracted light contributing to optical crosstalk and impinging on the second lens 84 at a position D increases the irradiance at a position D' which is shifted by a distance w upward.

For diffracted light contributing to optical crosstalk, the spatial irradiance distribution in the back focal plane 90 will not be independent on the angle of incidence of the projection light impinging on the homogenizing optical integrator 70, as it has been explained above with reference to FIG. 8 for the conventional arrangement. From the illustrations in FIGS. 10 and 11 it can be seen that an oblique illumination of the first optical raster plate 74 changes the direction of the diffraction orders 106 and thus the amount of light passing through the adjacent channels 92, 94. The diffraction orders 106 contributing to optical crosstalk then still contribute to the irradiance distribution 109 of width w that is determined by the points B' associated with the edges 82 of the optical channels. However, this irradiance distribution will now vary depending on the angle of incidence. Therefore laser pointing, for example, will have the effect that also the spatial irradiance distribution in the back focal plane 90 varies. This finally affects the spatial irradiance distribution in the pupil plane 56 of the illumination system 12 and thus the angular irradiance distribution in the mask plane 66.

Figure 12:
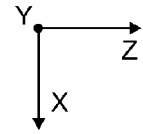
FIG. 12 is a schematic illustration showing the impact of arranging the first optical raster plate in a defocused axial position.
Figure 12:
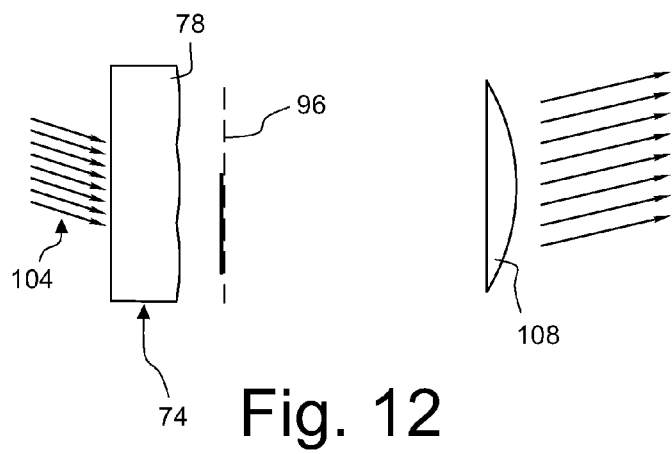

The shift which is associated with diffraction orders 106 contributing to optical crosstalk is compensated by the defocused arrangement of the first optical raster plate 74. FIG. 12 illustrates an oblique illumination of the first optical raster plate 74 which may be a result of laser pointing. The focal plane of the larger lens 108 of course coincides with the front focal plane 96 of the individual second lenses 84. Thus it is not the spatial irradiance distribution at the first optical raster plate 74, but the spatial irradiance distribution at the front focal plane 96 which is imaged by the second optical raster plate 76 and the condenser 72 on the focal plane 90 of the condenser 72. In the case of an oblique illumination of the first optical raster plate 74, the spatial irradiance distribution produced by each first lens 78 is shifted, as it is shown in FIG. 12. As a result of the inverting effect of the lens 108, this shift of the spatial irradiance distribution 116 is compensated for by an equal shift in the opposite direction.

V. EXAMPLES

Figure 13:
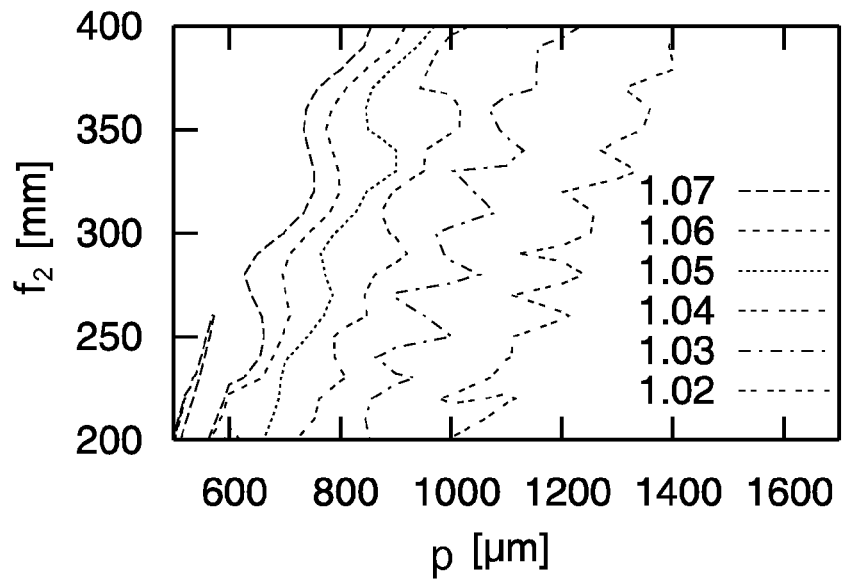
FIG. 13 is a graph illustrating the amount of defocus that is necessary for various combinations of pitch and focal length for the case of a symmetrical optical integrator.

FIG. 13 is a graph which illustrates for various combinations of pitch p and second focal length $f_2$ which ratio $d/f_2$ should be used to obtain the above described compensation. Here it is assumed that the wavelength λ equals 193 nm and the homogenizing optical integrator is symmetric, i.e. $f_1=f_2$. The waviness of the curves reflect the periodic nature of the diffraction orders.

Figure 14:
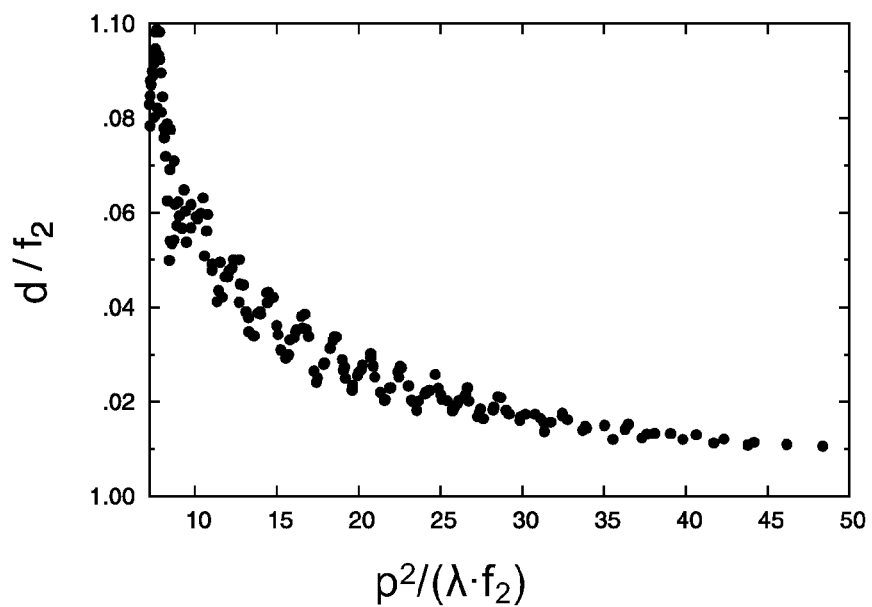
FIG. 14 is a graph illustrating the amount of defocus that is necessary depending on the number $p^2/(\lambda \cdot f_2)$.

FIG. 14 shows the result of computations in which the ratio $d/f_2$ is indicated depending on the number k as defined by equation (1). It can be seen that the smaller the parameter k is, the larger the defocus $d/f_2$ of the first optical raster plate 74 has to be.

Table 1 contains an example of numerical values for an optical integrator in accordance with the present invention.

The lens height h is defined as the height of the curved surface of the second lenses 84. As a result of the long focal length $f_2$, the height h is extremely small as compared to the distance d.

TABLE 1

| Wavelength λ | 193 nm |
|---|---|
| Pitch p | 1 mm |
| Focal length $f_2$ | 52 cm |
| Parameter k | 10 |
| Distance d | 55 cm |
| Ratio $d/f_2$ | 1.06 |
| Lens height h | 0.48 μm |

Figure 15:
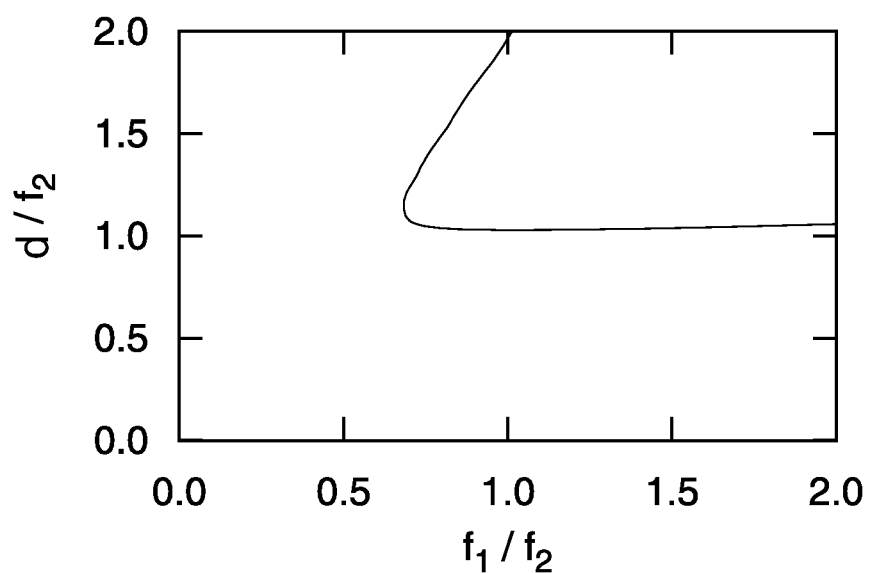
FIG. 15 is a graph illustrating possible solutions for an asymmetric optical integrator in which the lenses of the first and the second optical raster plates have different focal lengths.

FIG. 15 is a graph showing the ratio $d/f_2$ for an asymmetric homogenizing optical integrator for which the focal lengths of the first and second lenses 78, 84 are different ($f_1 \neq f_2$). All points lying on the curve are possible solutions. It can be seen that, for a given second focal length $f_2$, there are minimum values below which the first focal length $f_1$ cannot fall.

The invention claimed is:
1. An illumination system, comprising:
   an optical integrator, comprising:
      a first optical raster plate comprising an array of first lenses having a first focal length along a reference direction; and
      a second optical raster plate comprising an array of second lenses having a second focal length along the reference direction; and
   wherein:

vertices of the first lenses and vertices of the second lenses are spaced apart by a distance that is at least 1.01 times greater than the second focal length;

the array of second lenses has a pitch along the reference direction;

the pitch, the wavelength, the second focal length are given by p, λ, and $f_2$, respectively;

$p^2/(\lambda \cdot f_2) < 40$; and the illumination system is a microlithographic illumination system.

2. The illumination system of claim 1, wherein the distance is at least 1.02 times greater than the second focal length.

3. The illumination system of claim 1, wherein the distance is at least 1.05 times greater than the second focal length.

4. The illumination system of claim 1, further comprising a light source configured to produce projection light having a wavelength.

5. The illumination system of claim 4, wherein $p^2/(\lambda \cdot f_2) < 20$.

6. The illumination system of claim 4, wherein $p^2/(\lambda \cdot f_2) < 10$.

7. The illumination system of claim 4, further comprising a spatial light modulator configured to vary a spatial irradiance distribution in a pupil surface of the illumination system, wherein the optical integrator is between the light source and the spatial light modulator.

8. The illumination system of claim 7, wherein the spatial light modulator comprises a beam deflection array of reflective or transparent beam deflection elements, and each beam deflection element is configured to deflect a light beam by a deflection angle that is variable in response to a control signal applied to the beam deflection element.

9. The illumination system of claim 8, wherein the beam deflecting elements are tiltable mirrors.

10. The illumination system of claim 1, wherein the first focal length is not equal to the second focal length.

11. The illumination system of claim 1, further comprising a condenser having a front focal plane, wherein the second optical raster plate is arranged in the focal plane of the condenser.

12. The illumination system of claim 1, further comprising a spatial light modulator configured to vary a spatial irradiance distribution in a pupil surface of the illumination system.

13. The illumination system of claim 12, wherein the spatial light modulator comprises a beam deflection array of reflective or transparent beam deflection elements.

14. The illumination system of claim 13, wherein each beam deflection element is configured to deflect a light beam by a deflection angle that is variable in response to a control signal applied to the beam deflection element.

15. The illumination system of claim 14, wherein the beam deflecting elements are tiltable mirrors.

16. The illumination system of claim 13, wherein the beam deflecting elements are tiltable mirrors.

17. The illumination system of claim 12, further comprising a condenser having a front focal plane, wherein the second optical raster plate is arranged in the focal plane of the condenser.

18. An apparatus, comprising:
an illumination system configured to illuminate an object field of the apparatus; and
a projection objective configured to image the object field into an image field,
wherein:
the illumination system comprises an optical integrator, comprising:
a first optical raster plate comprising an array of first lenses having a first focal length along a reference direction; and
a second optical raster plate comprising an array of second lenses having a second focal length along the reference direction;
vertices of the first lenses and vertices of the second lenses are spaced apart by a distance that is at least 1.01 times greater than the second focal length;
the array of second lenses has a pitch along the reference direction;
the pitch, the wavelength, the second focal length are given by p, λ, and $f_2$, respectively;
$p^2/(\lambda \cdot f_2) < 40$; and
the apparatus is a microlithographic projection exposure apparatus.

19. The apparatus of claim 18, wherein $p^2/(\lambda \cdot f_2) < 20$.

20. The apparatus of claim 18, wherein $p2/(\lambda \cdot f_2) < 10$.

21. A method of using a microlithographic projection exposure apparatus comprising an illumination system and a projection objective, the method comprising:
using the illumination system to illuminate an object field; and
using the projection objective to image at least a portion of the object field into an image field,
wherein:
the illumination system comprises an optical integrator, comprising:
a first optical raster plate comprising an array of first lenses having a first focal length along a reference direction; and
a second optical raster plate comprising an array of second lenses having a second focal length along the reference direction;
vertices of the first lenses and vertices of the second lenses are spaced apart by a distance that is at least 1.01 times greater than the second focal length,
the array of second lenses has a pitch along the reference direction;
the pitch, the wavelength, the second focal length are given by p, λ, and $f_2$, respectively; and
$p^2/(\lambda \cdot f_2) < 40$.

22. The method of claim 21, wherein $p2/(\lambda \cdot f_2) < 20$.

23. The method of claim 21, wherein $p2/(\lambda \cdot f_2) < 10$.

* * * * *

UNITED STATES PATENT AND TRADEMARK OFFICE
CERTIFICATE OF CORRECTION

PATENT NO. : 9,671,699 B2
APPLICATION NO. : 14/632430
DATED : June 6, 2017
INVENTOR(S) : Michael Patra et al.

Page 1 of 1

It is certified that error appears in the above-identified patent and that said Letters Patent is hereby corrected as shown below:

On the Title Page

Column 2, Line 4, under "ABSTRACT", delete "first second" and insert -- first --.

In the Specification

Column 12, Line 47, delete "an a" and insert -- a --.

Column 13, Line 24, delete "the the" and insert -- the --.

In the Claims

Column 15, Line 7, Claim 1, delete "$\lambda$," and insert -- $\lambda$ --.

Column 16, Line 25, Claim 18, delete "$\lambda$," and insert -- $\lambda$ --.

Column 16, Line 49, Claim 21, delete "length," and insert -- length; --.

Column 16, Line 53, Claim 21, delete "$\lambda$," and insert -- $\lambda$ --.

Signed and Sealed this
Third Day of October, 2017

Joseph Matal
*Performing the Functions and Duties of the*
*Under Secretary of Commerce for Intellectual Property and*
*Director of the United States Patent and Trademark Office*